(12) United States Patent
Bang et al.

(10) Patent No.: US 10,177,117 B2
(45) Date of Patent: Jan. 8, 2019

(54) METHOD FOR FABRICATING SEMICONDUCTOR PACKAGE HAVING A MULTI-LAYER MOLDED CONDUCTIVE SUBSTRATE AND STRUCTURE

(71) Applicant: Amkor Technology Inc., Tempe, AZ (US)

(72) Inventors: Won Bae Bang, Gyeonggi-do (KR); Ju Hoon Yoon, Gyeonggi-do (KR); Ji Young Chung, Gyeonggi-do (KR); Byong Jin Kim, Gyeonggi-do (KR); Gi Jeong Kim, Gyeonggi-do (KR); Choon Heung Lee, Seoul (KR)

(73) Assignee: Amkor Technology Inc., Tempe, AZ (US)

( * ) Notice: Subject to any disclaimer, the term of this patent is extended or adjusted under 35 U.S.C. 154(b) by 0 days.

(21) Appl. No.: 15/133,081

(22) Filed: Apr. 19, 2016

(65) Prior Publication Data

US 2016/0343688 A1  Nov. 24, 2016

(30) Foreign Application Priority Data

May 22, 2015 (KR) .................. 10-2015-0071718

(51) Int. Cl.
*H01L 23/538* (2006.01)
*H01L 25/065* (2006.01)
(Continued)

(52) U.S. Cl.
CPC ...... *H01L 25/0657* (2013.01); *H01L 21/4857* (2013.01); *H01L 23/36* (2013.01);
(Continued)

(58) Field of Classification Search
CPC ....... H01L 21/4857; H01L 2224/81005; H01L 2224/83005; H01L 2924/15153;
(Continued)

(56) References Cited

U.S. PATENT DOCUMENTS

2007/0096292 A1* 5/2007 Machida ............. H01L 21/4857
257/700
2008/0308946 A1 12/2008 Pratt
(Continued)

FOREIGN PATENT DOCUMENTS

KR  10-2010-0029243 A   3/2010
KR  10-2010-0123664 A  11/2010
(Continued)

OTHER PUBLICATIONS

Office Action received from Korean Patent Office in Korean; English Translation Not Available; dated Feb. 20, 2016; 6 pages.

*Primary Examiner* — Frederick B Hargrove
(74) *Attorney, Agent, or Firm* — Kevin B. Jackson

(57) ABSTRACT

In one embodiment, a method for fabricating a semiconductor package includes providing a multi-layer molded conductive structure. The multi-layer molded conductive structure includes a first conductive structure disposed on a surface of a carrier and a first encapsulant covering at least portions of the first conductive structure while other portions are exposed in the first encapsulant. A second conductive structure is disposed on the first encapsulant and electrically connected to the first conductive structure. A second encapsulant covers a first portion of the second conductive structure while a second portion of the second conductive structure is exposed to the outside, and a third portion of the second conductive structure is exposed in a receiving space disposed in the second encapsulant. The method includes electrically connecting a semiconductor die to the second conductive structure and in some embodiments removing the carrier.

12 Claims, 6 Drawing Sheets

(51) Int. Cl.
*H01L 23/498* (2006.01)
*H01L 21/48* (2006.01)
*H01L 25/00* (2006.01)
*H01L 23/36* (2006.01)
*H01L 23/31* (2006.01)
*H01L 23/00* (2006.01)
*H01L 23/13* (2006.01)

(52) U.S. Cl.
CPC ........ *H01L 23/49822* (2013.01); *H01L 25/50* (2013.01); *H01L 23/13* (2013.01); *H01L 23/3128* (2013.01); *H01L 24/05* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/0401* (2013.01); *H01L 2224/0558* (2013.01); *H01L 2224/05573* (2013.01); *H01L 2224/05575* (2013.01); *H01L 2224/05611* (2013.01); *H01L 2224/05624* (2013.01); *H01L 2224/05639* (2013.01); *H01L 2224/05644* (2013.01); *H01L 2224/05655* (2013.01); *H01L 2224/13111* (2013.01); *H01L 2224/13116* (2013.01); *H01L 2224/13147* (2013.01); *H01L 2224/16227* (2013.01); *H01L 2224/16235* (2013.01); *H01L 2224/16238* (2013.01); *H01L 2224/32225* (2013.01); *H01L 2224/73204* (2013.01); *H01L 2224/81005* (2013.01); *H01L 2224/81815* (2013.01); *H01L 2224/83005* (2013.01); *H01L 2224/92125* (2013.01); *H01L 2225/06517* (2013.01); *H01L 2225/06548* (2013.01); *H01L 2225/06572* (2013.01); *H01L 2225/06589* (2013.01); *H01L 2924/15153* (2013.01); *H01L 2924/15311* (2013.01); *H01L 2924/15321* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01)

(58) Field of Classification Search
CPC ..... H01L 2225/06589; H01L 23/49822; H01L 24/92; H01L 23/49827; H01L 21/486; H01L 25/0657
See application file for complete search history.

(56) References Cited

U.S. PATENT DOCUMENTS

| | | | |
|---|---|---|---|
| 2009/0170242 A1* | 7/2009 | Lin | H01L 21/6835 438/107 |
| 2010/0289134 A1* | 11/2010 | Chow | H01L 21/563 257/692 |
| 2011/0228464 A1* | 9/2011 | Guzek | H01L 23/49816 361/679.31 |
| 2013/0127025 A1 | 5/2013 | Cho | |
| 2014/0070403 A1* | 3/2014 | Pan | H01L 21/56 257/737 |
| 2014/0299976 A1 | 10/2014 | Cho | |
| 2015/0179616 A1* | 6/2015 | Lin | H01L 25/50 257/773 |
| 2015/0194415 A1 | 7/2015 | Pratt | |
| 2015/0359096 A1* | 12/2015 | Hsu | H01L 24/17 361/761 |
| 2016/0064328 A1* | 3/2016 | Kwon | H01L 25/071 327/565 |

FOREIGN PATENT DOCUMENTS

| | | |
|---|---|---|
| KR | 10-2013-0056570 A | 5/2013 |
| KR | 10-2014-0111546 A | 9/2015 |

* cited by examiner

METHOD FOR FABRICATING SEMICONDUCTOR PACKAGE HAVING A MULTI-LAYER MOLDED CONDUCTIVE SUBSTRATE AND STRUCTURE

CROSS-REFERENCE TO RELATED APPLICATIONS

This application claims priority to and the benefit of Korean Patent Application No. 10-2015-0071718 filed on May 22, 2015 in the Korean Intellectual Property Office, and all the benefits accruing therefrom under 35 U.S.C. § 119, the contents of which in its entirety are herein incorporated by reference.

BACKGROUND

The present invention relates, in general, to electronics, and more particularly, to semiconductor packages, structures thereof, and methods of forming semiconductor packages.

According to the recent demand for miniaturization and high performance of electronic devices, a variety of processes for providing a high-performance semiconductor package are researched and developed. One of the processes for providing a high-performance semiconductor package is to increase a capacity of a memory chip, that is, to achieve high integration of memory chips. The high integration of memory chips can be achieved by packing as many cells as possible in a limited space of a semiconductor die.

However, the high integration of memory chips requires highly sophisticated techniques, including, for example, a need for attaining precise, fine linewidths, and a long time for development. Alternatively, a semiconductor die stacking technique has been proposed to provide a high-capacity semiconductor module. A technique of fabricating a package on a level of a wafer having a plurality of semiconductor dies formed thereon has also been proposed. In addition to requiring expensive and complex manufacturing techniques, each of these techniques lacks in circuit pattern redesign flexibility.

Accordingly, it is desirable to have a structure and a method of forming a packaged semiconductor device that addresses the issues noted previously as well as others. It is also desirable for the structure and method to be easily incorporated into manufacturing flows, and to be cost effective.

BRIEF DESCRIPTION OF THE DRAWINGS

The above and other features of the present description will become more apparent by describing in detail exemplary embodiments thereof with reference to the attached drawings in which.

Figure 1:
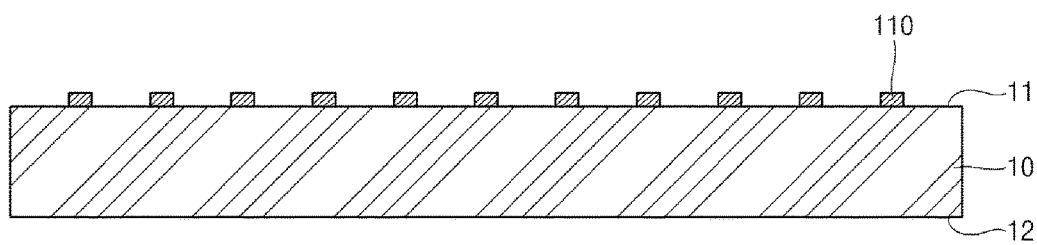
FIGS. 1 to 11 are partial cross-sectional views sequentially illustrating a method for fabricating a semiconductor package according to an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a multi-layer molded conductive substrate or multi-layer molded conductive structure including at least two layers of encapsulated or molded conductive interconnect structures. In some embodiments, a carrier is attached to a surface of the multi-layer molded conductive structure as a temporary support structure. In other embodiments, the carrier can be configured as a heat slug or heat sink structure. Electronic components, such as semiconductor devices and/or passive devices can be attached to the multi-layer molded conductive structure including attachment within recessed portions. Upper level conductive patterns and/or connective structures in the multi-layer carrier can be redesigned during the fabrication process to allow for flexible, time saving, and cost effective manufacturing capability.

More particularly, in one embodiment a method for fabricating a semiconductor package includes providing a multi-layer molded conductive structure comprising a first conductive structure disposed on a first surface of a carrier, a first encapsulant encapsulating at least portions of the first conductive structure, while other portions of the first conductive structure are exposed in the first encapsulant, a second conductive structure disposed on the first encapsulant and electrically coupled to the first conductive structure; and a second encapsulant encapsulating a first portion of the second conductive structure, while a second portion of the second conductive structure is exposed in the second encapsulant, and a third portion of the second conductive structure is exposed in a receiving space disposed in the second encapsulant. The method includes electrically connecting a first semiconductor die to the third portion of the second conductive structure in the receiving space.

In another embodiment, a semiconductor package includes a first conductive structure. A first encapsulant encapsulates at least portions of the first conductive structure, while other portions of the first conductive structure are exposed in the first encapsulant. A second conductive structure is disposed on the first encapsulant and is electrically connected to the first conductive structure. A second encapsulant encapsulates a first portion of the second conductive structure, while a second portion of the second conductive structure is exposed in the second encapsulant. A first semiconductor die is electrically connected to the second conductive structure.

In a further embodiment, a semiconductor package includes a first conductive pattern and a first conductive pillar electrically connected to the first conductive pattern. A first encapsulant encapsulates the first conductive pattern and the first conductive pillar. A second conductive pattern is electrically connected to the first conductive pillar, which is exposed to the outside of the first encapsulant. A second conductive pillar is electrically connected to a portion of the second conductive pattern. A second encapsulant encapsulates a first portion of the second conductive pattern and a portion of the second conductive pillar. A receiving space is provided in the second encapsulant exposing at least a second portion of the second conductive pattern. A first semiconductor die is placed in the receiving space and electrically connected to the second portion of the second conductive pattern.

Turning now to FIGS. 1-11, a method for fabricating a semiconductor package according to first embodiment and a semiconductor package 1000 fabricated using the method will be described. FIGS. 1-11 are partial cross-sectional views illustrating a method for fabricating a semiconductor package according to a first embodiment.

First, as illustrated in FIG. 1, a first conductive pattern 110 is formed on a first surface 11 of a carrier 10. Here, the carrier 10 comprising the first surface 11 further includes a second surface 12 that is opposite to the first surface 11. In one embodiment, carrier 10 has a thickness in a range from approximately 3 microns through 300 microns. In some embodiments, the carrier 10 may be formed of one or more of a metal, silicon, glass, an epoxy resin or other materials as known to those of skill in the art. At least the first surface 11 is prepared and cleaned for receiving the first conductive pattern 110.

In one embodiment, the first conductive pattern 110 may be made of a conductive material comprising copper (Cu), gold (Au), silver (Ag), aluminum (Al) or other materials as known to those of skill in the art. In addition, the first conductive pattern 110 may be formed by physical vapor deposition (PVD), chemical vapor deposition (CVD), metal sputtering, metal evaporation, electrolytic or electroless plating or other formation techniques as known to those of skill in the art. In one embodiment, the first conductive pattern 110 has a thickness in a range from approximately 3 microns through 50 microns.

After deposition, the conductive material may be patterned by physical etching or chemical etching, or other techniques as known to those of skill in the art. In other embodiments, a masking layer (not shown) may be first deposited on the first major surface 11 and the conductive material subsequently deposited. The masking layer may or may not be removed after the conductive pattern is formed depending on the application.

Figure 2:
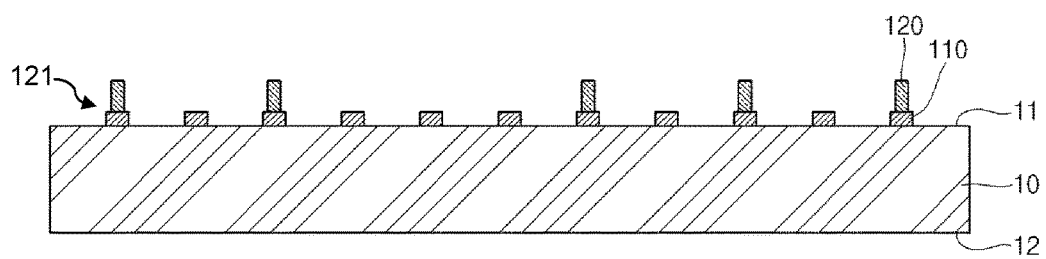

Next, referring to FIG. 2, one more or more first conductive pillars 120 electrically connected to the first conductive pattern 110 are formed. The first conductive pillar 120 is formed to extend away or outward from the first conductive pattern 110 and from first surface 11 of the carrier 10. In one embodiment, the first conductive pillar 120 is preferably formed of a material having good electrical, thermal conductivity, such as copper (Cu), a copper alloy or an equivalent thereof, but the shape and material of the first conductive pillar 120 are not limited to those disclosed herein. In one embodiment, the first conductive pillar 120 has a thickness in a range from approximately 30 microns through 300 microns. In addition, the first conductive pillar 120 may be formed using PVD, CVD, metal sputtering, metal evaporation, electrolytic or electroless plating or other formation techniques as known to those of skill in the art. In one embodiment, electrolytic or electroless plating techniques are used with a masking layer provided over the first major surface 11 and having a preselected pattern for forming the first conductive pillars 120 in desired locations. In one embodiment, the first conductive pillar 120 has a different width than the first conductive pattern 110. In one embodiment, a first conductive structure 121 may comprise one or more of the first conductive pattern 110 and the first conductive pillar 120 and/or additional conductive structures.

Figure 3:
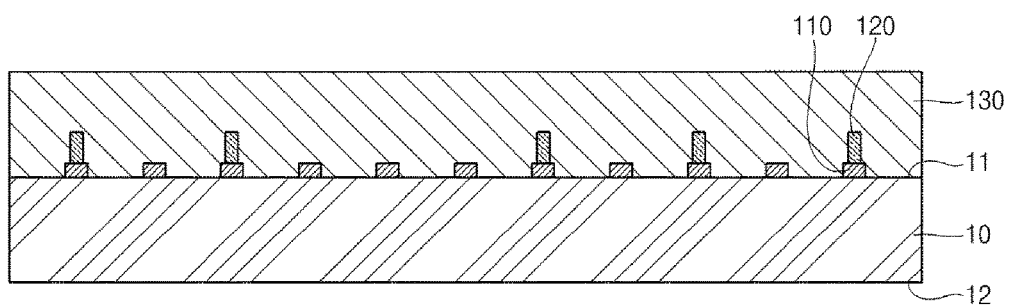

Next, referring to FIG. 3, a top portion of the first surface 11 of the carrier 10, that is, an outer surface of each of the first conductive pattern 110 and the first conductive pillar 120, is encapsulated by a first encapsulant 130 or first molded encapsulant 130.

In one embodiment, the first encapsulant 130 completely encapsulates and covers the first conductive pattern 110 and the first conductive pillar 120 to protect the first conductive pattern 110 and the first conductive pillar 120 so as not to be damaged by, for example, external shocks or oxidation. In one embodiment, the first encapsulant 130 is formed to a greater thickness than the first conductive pillar 120. In other embodiments, the first encapsulant can be formed to flush with a distal end of the first conductive pillar 120. Here, the first encapsulant 130 may be a polymer composite material, such as an epoxy mold compound for performing encapsulation through a molding process, a liquid encapsulating member for performing encapsulation through a dispenser, or an equivalent thereof, but aspects of the present embodiment are not limited thereto.

Figure 4:
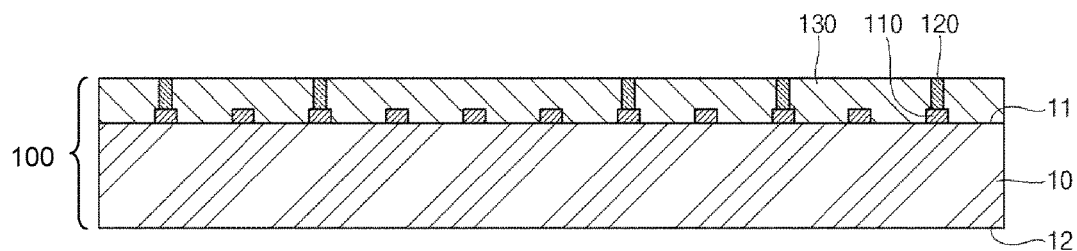

Next, referring to FIG. 4, portions of the first encapsulant 130 are removed using a removal process. In one embodiment, a grinding process is used on one surface of the first encapsulant 130 to remove material to a predetermined thickness so as to expose the first conductive pillar 120 to the outside of the first encapsulant 130. Here, the grinding may be performed using, for example, a diamond grinder or an equivalent thereof, but aspects of the present invention are not limited thereto. In other embodiments, masking and etching techniques along with or in combination with grinding techniques may be used to remove portions of the first encapsulant 130. In one embodiment, the structure of FIG. 4 can be referred to as a molded carrier sub-assembly 100 or a first molded carrier 100, which includes the carrier 10, the first conductive pattern 110, one or more first conductive pillars 120, and the first encapsulant 130. In most embodiments, the molded carrier sub-assembly 100 includes the one or more first conductive pillars 120 exposed to the outside of the first encapsulant 130 as generally illustrated in FIG. 4. In one embodiment, the molded carrier sub-assembly 100 can be pre-made and inventoried in anticipation of design modifications to be implemented in a second conductive pattern 140 and second conductive pillar 150 as described hereinafter. In accordance with the present embodiment, this provides enhanced design flexibility and saves on manufacturing costs and cycle time.

Figure 5:
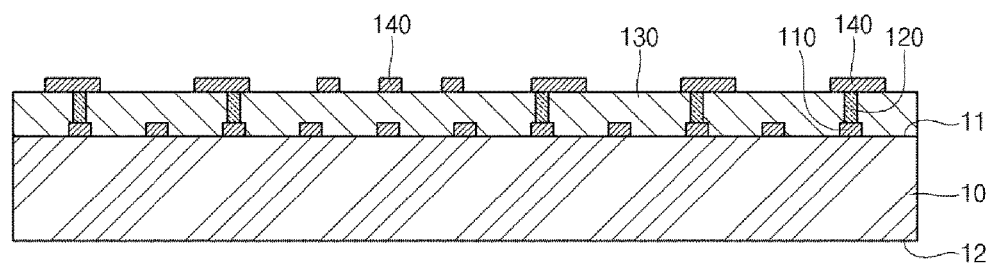

Next, referring to FIG. 5, a second conductive pattern 140 electrically connected to the first conductive pillar 120 exposed to the outside of the first encapsulant 130 is formed.

Here, the second conductive pattern 140 may be made of a conductive material comprising copper (Cu), gold (Au), silver (Ag), aluminum (Al) or other materials as known to those of skill in the art. In addition, the second conductive pattern 140 may be formed by physical vapor deposition (PVD), chemical vapor deposition (CVD), metal sputtering, metal evaporation, electrolytic or electroless plating or other formation techniques as known to those of skill in the art. In one embodiment, the second conductive pattern 140 has a thickness in a range from approximately 3 microns through 50 microns. The conductive material selected for the second conductive pattern 140 may be the same or different than the conductive material selected for the first conductive pattern 110.

In accordance with the present embodiment, since the second conductive pattern 140 may be differently patterned from the first conductive pattern 110 in terms of, for example, location and shape, a circuit pattern can be easily redesigned or modified according to requirements of a first semiconductor die or other electrical components or electronic devices to be described later.

Figure 6:
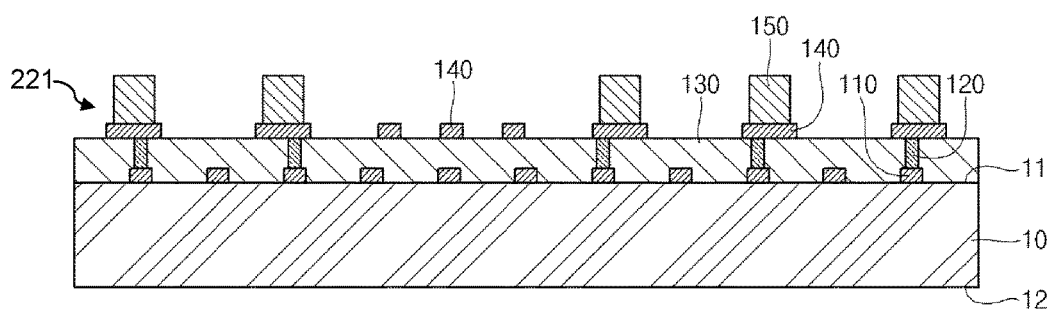

Next, referring to FIG. 6, one or more second conductive pillars 150 electrically connected to the second conductive pattern 140 are formed. Here, the second conductive pillar 150 may be selectively connected to a portion of the second conductive pattern 140. The second conductive pillar 150 is formed to upwardly extend away or outward from the second conductive pattern 140 and is preferably formed of a material having good electrical, thermal conductivity, such as copper (Cu), a copper alloy or an equivalent thereof, but the shape and material of the second conductive pillar 150 are not limited to those disclosed therein. In one embodiment, the second conductive pillar 150 has a thickness in a range from approximately 30microns through 300 microns. In addition, the second conductive pillar 150 may be formed using PVD, CVD, metal sputtering, metal evaporation, electrolytic or electroless plating or other formation techniques as known to those of skill in the art. In one embodiment, electrolytic or electroless plating techniques are used with a masking layer (not shown) provided over the surface of the first encapsulant 130 and having a preselected pattern for forming the second conductive pillars 150 in desired locations. In one embodiment, the second conductive pillar 150 has a different width than the second conductive pattern 140 and can further have a different width and shape than the first conductive pillar 120. In one embodiment, a second conductive structure 221 may comprise one or more of the second conductive pattern 140 and the second conductive pillar 150 and/or other conductive structures.

Figure 7:
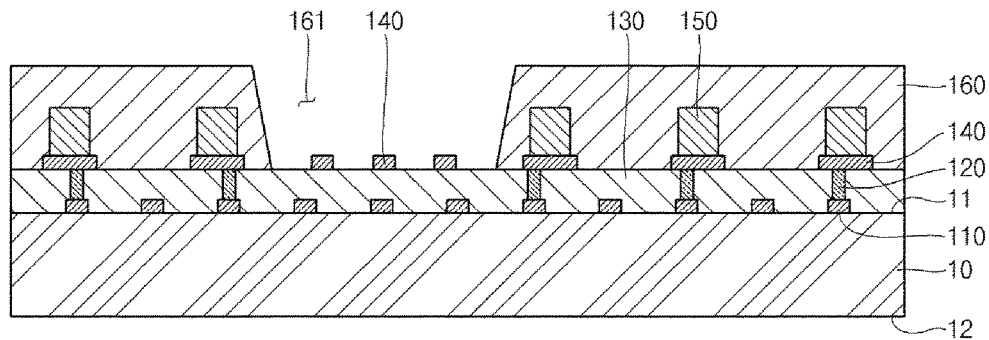

Next, referring to FIG. 7, a top portion of the first encapsulant 130, that is, an outer surface of each of the second conductive pattern 140 and the second conductive pillar 150, is encapsulated by a second encapsulant 160. In one embodiment, the second encapsulant 160 further includes a receiving space 161 formed to prevent the remaining region of the second conductive pattern 140, to which the second conductive pillar 150 is not connected, from being encapsulated. The receiving space 161 may be formed using a screen mask or an equivalent thereof, but aspects of the present invention are not limited thereto. In other embodiments, the receiving space 161 may formed after the second encapsulant 160 is formed. In other embodiments, sidewall portions of the conductive pattern 140 within receiving space 161 may be encapsulated or covered by the second encapsulant 160 or other insulating materials. In one embodiment, receiving space 161 is configured having sloped sidewalls as generally illustrated in FIG. 7 so as to better facilitate manufacturing and to avoid sharp corners in the second encapsulant 160.

The second encapsulant 160 completely encapsulates and covers a portion of the second conductive pattern 140 and the second conductive pillar 150 to protect the second conductive pattern 140 and the second conductive pillar 150 so as not to be damaged by, for example, external shocks or oxidation. In one embodiment, the second encapsulant 160 is formed to a greater thickness than the second conductive pillar 150. Alternatively, the second encapsulant 160 may be formed so as to be substantially flush with a distal end of the second conductive pillar 150. In some embodiments, the second encapsulant 160 may be a polymer composite material, such as an epoxy mold compound for performing encapsulation through a molding process, a liquid encapsulating member for performing encapsulation through a dispenser, or an equivalent thereof, but aspects of the present embodiment are not limited thereto. The second encapsulant 160 may be the same material or a different material than that of the first encapsulant 130. In accordance with the present embodiment, the first encapsulant 130 and the second encapsulant 160 are distinct and separate material regions.

Figure 8:
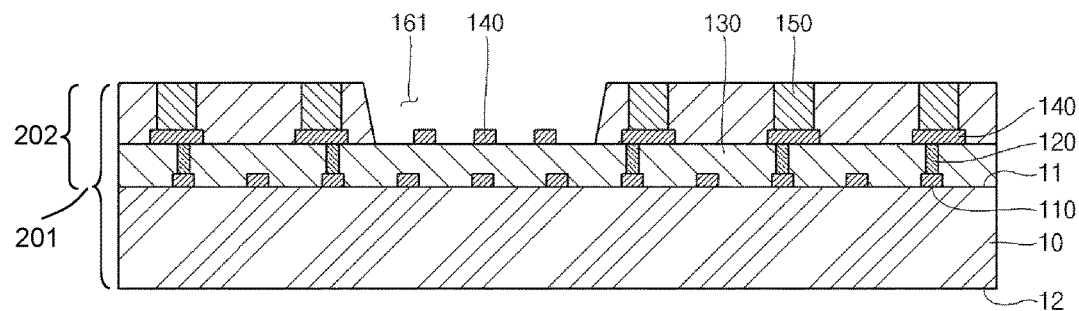

Next, referring to FIG. 8, portions of the second encapsulant 160 are removed using a removal process. In one embodiment a grinding process is used on one surface of the second encapsulant 160 to remove material to a predetermined thickness so as to expose the second conductive pillar 150 to the outside of the second encapsulant 160. In one embodiment, the grinding may be performed using, for example, a diamond grinder or an equivalent thereof, but aspects of the present invention are not limited thereto. In other embodiments, masking and etching techniques along or in combination with grinding techniques may be used to remove portions of the second encapsulant 160. In an alternative embodiment, the receiving space 161 may be formed after portions of the second encapsulant 160 are removed. In one embodiment, the structure of FIG. 8 can be referred to as a multi-layer molded conductive structure 201, a multi-layer molded conductive substrate 201, a molded carrier structure 201, or a second molded carrier 201, which includes the molded carrier sub-assembly 100, the second conductive pattern 140, one or more second conductive pillars 150, and the second encapsulant 160 having one or more receiving spaces 161. In most embodiments, the multi-layer molded conductive structure 201 includes the one or more second conductive pillars 150 exposed to the outside of the second encapsulant 160. In other embodiments, a multi-layer molded conductive structure 202 or multi-layer molded conductive substrate 202 includes the first conductive pattern 110, the first encapsulant 130, the second conductive pattern 140, the one or more second conductive pillars 150, and the second encapsulant 160 without the carrier 10.

Figure 9:
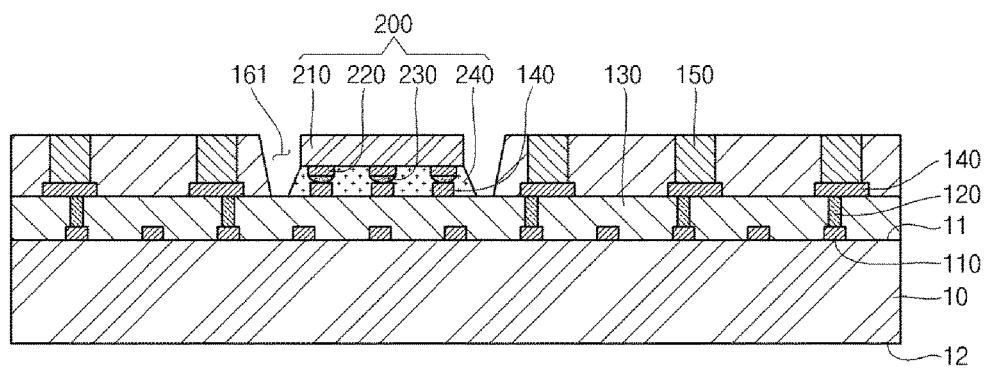

Next, referring to FIG. 9, a first semiconductor module 200 is disposed or placed in the receiving space 161 to be electrically connected to the remaining portion of the second conductive pattern 140, which is not encapsulated by the second encapsulant 160. In some embodiments, the first semiconductor module 200 includes a first semiconductor die 210, a first bond pad 220, a first conductive bump 230 and a first underfill 240. The first semiconductor die 210 has a bottom surface to which the first bond pad 220 electrically connected to an active layer (not shown) is exposed. In one embodiment, the first bond pad 220 comprises a conductive material, such as one or more layers of aluminum, copper, tin, nickel, gold silver or other suitable electrically conductive materials.

The first conductive bump 230 electrically and physically connects the first bond pad 220 and the second conductive pattern 140 through a reflow process and is formed of one or more conductive materials, such as lead/tin (Pb/Sn) or leadless Sn and an equivalent thereof, or other suitable electrically conductive materials. In one embodiment, the first conductive bump 230 may be a solder bump, a copper pillar, a solder ball or a ball-type bump. In one embodiment, the first underfill 240 is filled or disposed between one surface of the first encapsulant 130 and a bottom surface of the first semiconductor die 210, followed by a curing process.

In accordance with the present embodiment, the first underfill 240 protects a bump bonding portion from external factors, such as mechanical shocks or corrosion, generated in the course of fabricating a semiconductor package. Here, the first underfill 240 may be a polymer materials, such as one or more of epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxed underfill, or other materials as known to those of skill in the art. In one embodiment, the first semiconductor die 210 has a major surface (e.g., the surface opposite to the first conductive bump 230) that resides on substantially the same plane (e.g., a horizontal plane) as an outer surface of the second encapsulant 160. In other embodiments, the major surface of the first semiconductor die 210 and the outer surface of the second encapsulant 160 reside on different planes (e.g., horizontal planes).

Figure 10:
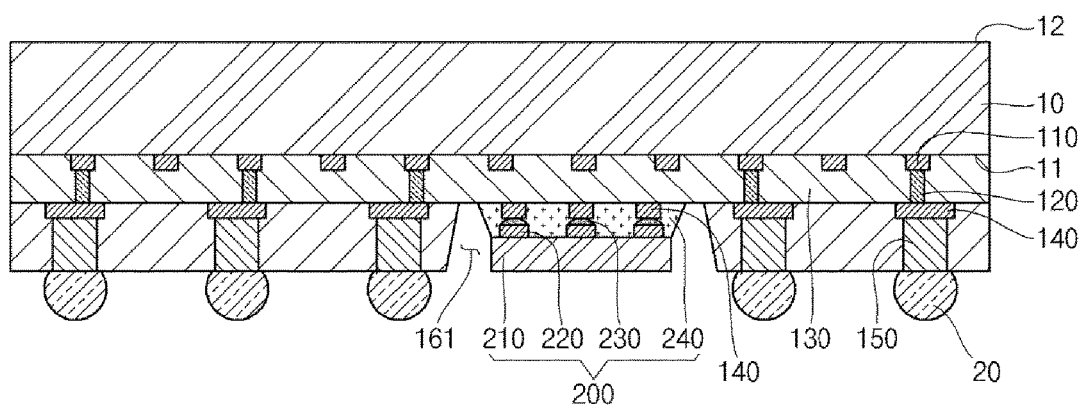
Figure 11:
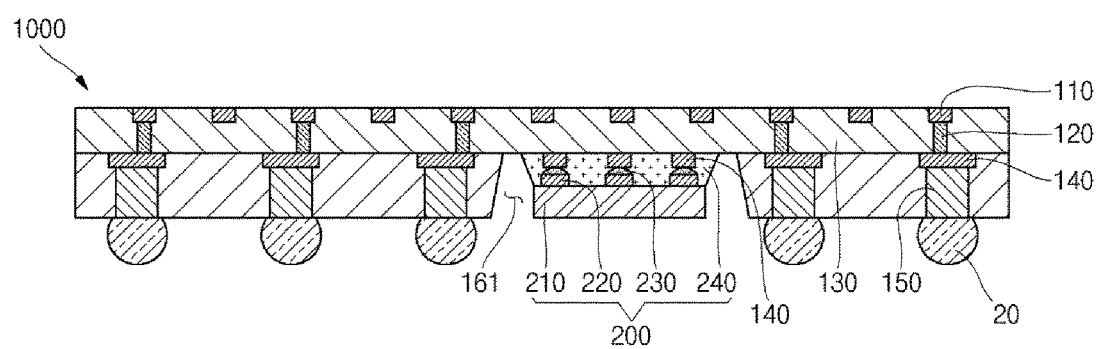

Next, referring to FIGS. 10 and 11, the semiconductor package 1000 according to another embodiment of the present invention is fabricated by attaching one or more conductive bumps 20 to be electrically connected to the second conductive pillar(s) 150 exposed to the outside of the second encapsulant 160. In one embodiment, the conductive bump 20 may be metal material, such as lead/tin (Pb/Sn) or leadless Sn or other materials as known to those of skill in the art. In one embodiment, the conductive bump 20 may be a solder bump, a copper pillar, a solder ball or a ball-type bump. In accordance with the present embodiment, the outer major surface of the semiconductor die 210 and distal ends or surfaces of the conductive bumps 20 reside on different plants so to provide a gap between the first semiconductor die 210 and a next level of assembly (e.g., a printed circuit board) when the semiconductor package 1000 is attached thereto. In one embodiment, the carrier 10 is separated to provide the semiconductor package 1000 as illustrated in FIG. 11, with the first conductive pattern 110 exposed to the outside for further interconnect functionality or heating sinking as will be described with further embodiments hereinafter.

Figure 12:
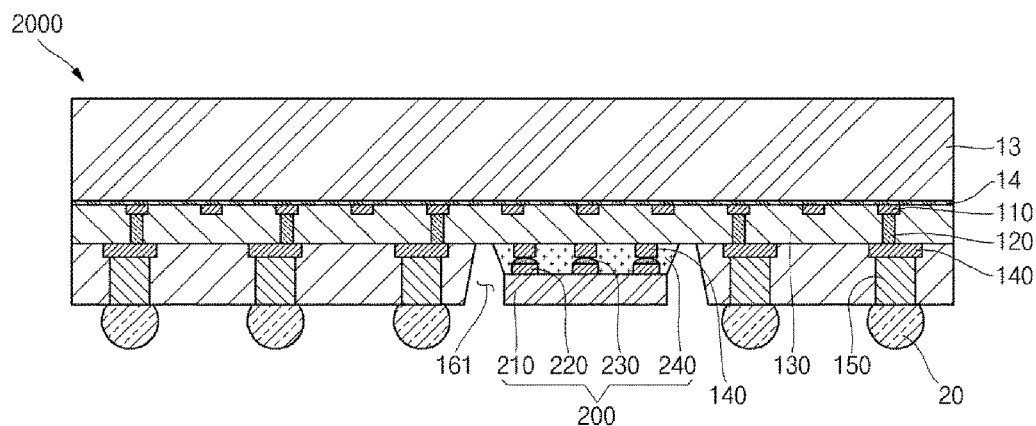
FIG. 12 is a partial cross-sectional view illustrating a semiconductor package according to another embodiment of the present invention.

FIG. 12 illustrates a partial cross-sectional view a semiconductor package 2000 according to another embodiment. In one embodiment, a heat sink 13 or a heat slug 13 is attached to a top portion of the first encapsulant 130. In one embodiment, the heat slug 13 may be separately attached to the first encapsulant 130. In one preferred embodiment, carrier 10 is configured as the heat slug 13 (e.g., comprises a thermally conductive material) using an insulating layer 14 interposed between the carrier 10 and the first encapsulant layer 130. In some embodiments, the heat slug 13 is preferably formed of a metal having high thermal conductivity and a low coefficient of thermal expansion. However, since the heat slug 13 is directly connected to the exposed first conductive pattern 110, an insulating layer 14 is interposed between the heat slug 13 and the first conductive pattern 110 to prevent an electric short from occurring between the heat slug 13 and the first conductive pattern 110. In some embodiments, the heat slug 13 may be formed of a material having high thermal conductivity, such as silicon, glass or an epoxy resin, and a metal and/or ceramic powder are formed within the heat slug 13.

Figure 13:
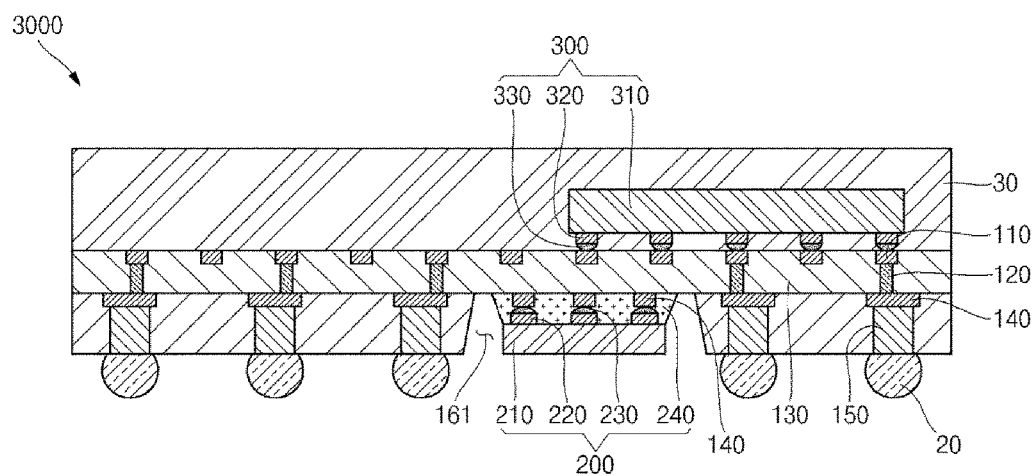
FIG. 13 is a partial cross-sectional view illustrating a semiconductor package according to still another embodiment of the present invention.

FIG. 13 illustrates a partial cross-sectional view of a semiconductor package 3000 according to a further embodiment. In one embodiment, after the carrier 10 is separated from the first encapsulant 130, a second semiconductor module 300 is placed to be electrically connected to the first conductive pattern 110 at a top portion of the first encapsulant 130, and an outer surface of the second semiconductor module 300 is encapsulated by a third encapsulant 30 at the top portion of the first encapsulant 130.

In one embodiment, the second semiconductor module 300 includes a second semiconductor die 310, a second bond pad 320, a second conductive bump 330 and a second underfill (not shown). The second semiconductor die 310 has a bottom surface to which the second bond pad 320 electrically connected to an active layer (not shown) is exposed. In one embodiment, the second bond pad 320 comprises a conductive material, such as one or more layers of aluminum, copper, tin, nickel, gold silver or other suitable electrically conductive materials.

The second conductive bump 330 electrically and physically connects the second bond pad 320 and the first conductive pattern 110 through a reflow process and is formed of one or more conductive materials, such as lead/tin (Pb/Sn) or leadless Sn and an equivalent thereof, or other suitable electrically conductive materials. In one embodiment, the second conductive bump 330 may be a solder bump, a copper pillar, a solder ball or a ball-type bump. The third encapsulant 30 may be formed of the same material as the first encapsulant 130 as described previously. In other embodiments, the third encapsulant 30 may be formed so as to expose the second semiconductor module 300 or second semiconductor die 310 to the outside to provide, for example, improved heat dissipation with or without a heat slug.

Figure 14:
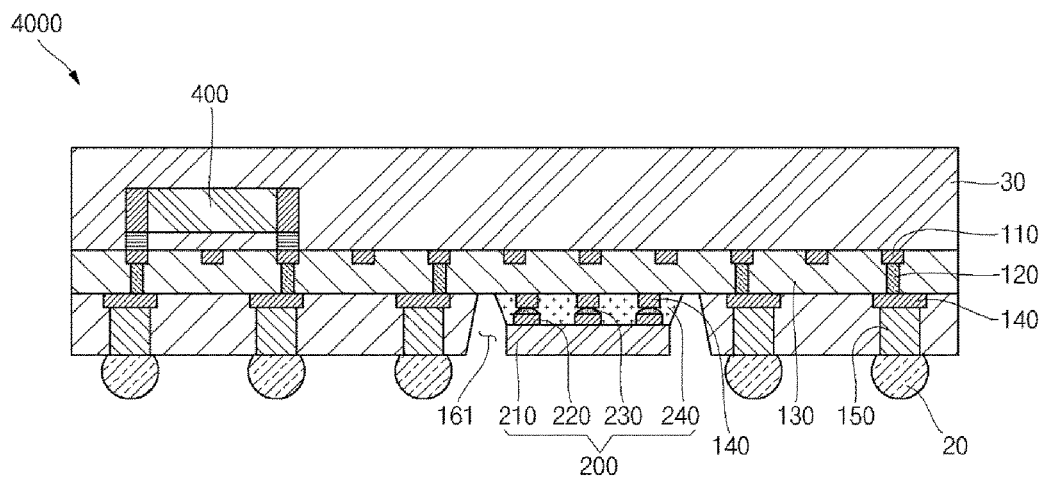
FIG. 14 is a partial cross-sectional view illustrating a semiconductor package according to still another embodiment of the present invention.

FIG. 14 illustrates a partial cross-sectional view of a semiconductor package 4000 according to a still further embodiment. In one embodiment, after the carrier 10 is separated from the first encapsulant 130, a passive element 400 is placed to be electrically connected to a first conductive pattern 110 at a top portion of the first encapsulant 130 and is attached to be capable of exchanging signals. In addition, an outer surface of the passive element 400 is encapsulated by the third encapsulant 30 at the top portion of the first encapsulant 130. In one embodiment, the passive element 400 may be formed as a resistor, an inductor or a capacitor. The third encapsulant 30 may be formed of the same material as the first encapsulant 130 as described previously.

Figure 15:
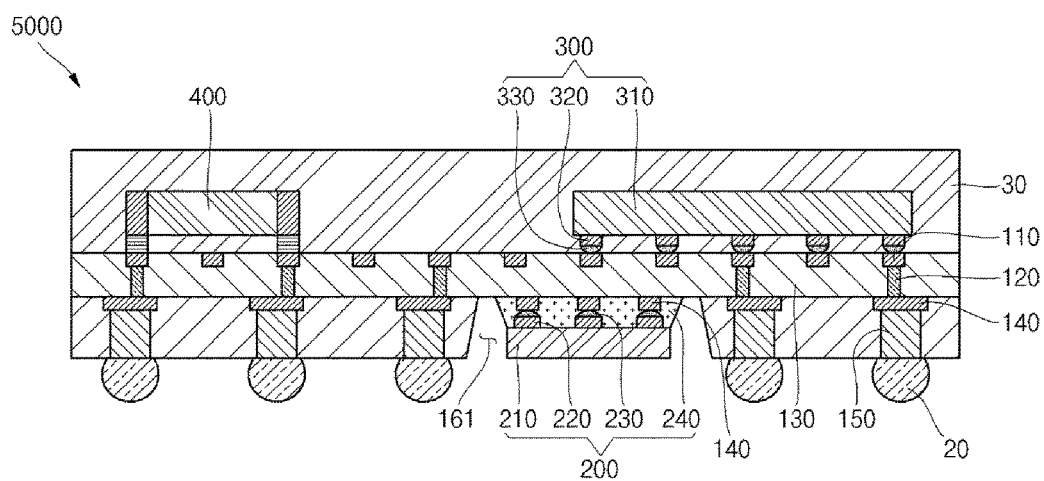
FIG. 15 is a partial cross-sectional view illustrating a semiconductor package according to still another embodiment of the present invention.

FIG. 15 illustrates a partial cross-sectional view of a semiconductor package 5000 according to another embodiment. In one embodiment, after the carrier 10 is separated from the first encapsulant 130, the second semiconductor module 300 and the passive element 400 are placed to be electrically connected to a first conductive pattern 110 at a top portion of a first encapsulant 130 and are attached to be capable of exchanging signals. In addition, outer surfaces of the second semiconductor module 300 and the passive element 400 are encapsulated by the third encapsulant 30 at the top portion of the first encapsulant 130. In one embodiment, the second semiconductor module 300 and the passive element 400 are as described previously in conjunction with FIGS. 13 and 14. The third encapsulant 30 may be formed of the same material as the first encapsulant 130 as described previously. In alternative embodiments, the third encapsulant 30 may be formed so as to expose a surface of the second semiconductor die 310 as described previously.

From all of the foregoing, one of skill in the art can determine that in accordance with another embodiment, a method for fabricating a semiconductor package includes forming a first conductive pattern on a first surface of a carrier, forming a first conductive pillar to be electrically connected to the first conductive pattern, firstly encapsulating the first conductive pattern and the first conductive pillar using a first encapsulant, forming a second conductive pattern to be electrically connected to the first conductive pillar exposed to the outside of the first encapsulant, forming a second conductive pillar to be electrically connected to a portion of the second conductive pattern, second encapsulating the portion of the second conductive pattern and the second conductive pillar using a second encapsulant and formed a receiving space in which the remaining portion of the second conductive pattern is exposed, and placing a first semiconductor die in the receiving space to be electrically connected to the second conductive pattern exposed to the outside of the second encapsulant.

From all of the foregoing, one of skill in the art can determine that in accordance with a further embodiment, a semiconductor package includes a first conductive pattern, a first conductive pillar electrically connected to the first conductive pattern, a first encapsulant encapsulating the first conductive pattern and the first conductive pillar, a second conductive pattern electrically connected to the first conductive pillar exposed to the outside of the first encapsulant, a second conductive pillar electrically connected to a portion of the second conductive pattern, a second encapsulant forming a receiving space in which the remaining portion of the second conductive pattern is exposed and encapsulating a portion of the second conductive pattern and the second conductive pillar, and a first semiconductor die electrically connected to the second conductive pattern exposed to the outside of the second encapsulant and placed in the receiving space.

In view of all the above, it is evident that a novel method of fabricating a semiconductor package using a multi-layer molded conductive structure having a flexible design capability as well as the structure have been disclosed. Including, among other features, is a first conductive structure encapsulated with a first molded encapsulant and a second conductive structure disposed on the first molded encapsulant and electrically connected to the first conductive structure. The second conductive structure facilitates flexible design changes or redesigns to the package substrate interconnect structure. A second molded encapsulant encapsulates at least portions of the second conductive structure and an electronic device is electrically connected to the second conductive pattern.

In some embodiments, one or more additional electronic devices can be electrically connected to the first conductive pattern. In other embodiments, a heat slug can be attached to the semiconductor package.

While the present invention has been particularly shown and described with reference to exemplary embodiments thereof, it will be understood by those of ordinary skill in the art that various changes in form and details may be made therein without departing from the spirit and scope of the present invention as defined by the following claims.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method for fabricating a semiconductor package, comprising:
   providing a multi-layer molded conductive structure comprising:
      a first conductive structure comprising a first conductive pattern on a first surface of a carrier and a first conductive pillar attached to the first conductive pattern, wherein the first conductive pattern is wider than the first conductive pillar where the first conductive pillar is attached to the first conductive pattern, and wherein the first conductive pattern defines an outermost patterned conductive structure for the semiconductor package;
      a first encapsulant encapsulating the first conductive structure, wherein:
         the first conductive pattern has an outer surface exposed in a first surface of the first encapsulant adjacent the first surface of the carrier;
         the first conductive pattern has a side surface embedded within the first encapsulant;
         the first conductive pillar is exposed in a second surface of the first encapsulant, which is opposite to the first surface of the first encapsulant; and the outer surface of the first conductive pattern is substantially flush with the first surface of the first encapsulant;
a second conductive structure comprising a second conductive pattern attached to the first conductive structure and a second conductive pillar attached to a first portion of the second conductive pattern; and
a second encapsulant encapsulating the second conductive structure, wherein:
the second conductive pattern has an outer surface exposed in a first surface of the second encapsulant that adjoins the second surface of the first encapsulant;
a second portion of the second conductive pattern is exposed in a receiving space having sloped sidewall surfaces, wherein the second portion is provided absent direct physical contact in the receiving space to any first and second conductive pillars; and
the second conductive pillar is exposed in a second surface of the second encapsulant opposite to the first surface of the second encapsulant;
electrically coupling a first semiconductor die to the second portion of the second conductive pattern in the receiving space;
providing a first underfill disposed between the second surface of the first encapsulant and a surface of the first semiconductor die, wherein the first underfill physically contacts side surfaces of the second portion of the second conductive pattern in the receiving space,
thereafter removing the carrier;
providing a second semiconductor die and a passive element placed to be electrically coupled to the first conductive pattern adjacent the first surface of the first encapsulant, wherein the first conductive pillar is laterally interposed between the passive element and the first semiconductor die such that the passive element does not overlap the first conductive pillar; and
providing a third encapsulant encapsulating the second semiconductor die and the passive element, wherein the passive element and the first semiconductor die do not laterally overlap, and wherein the second semiconductor die and the first semiconductor die only partially laterally overlap.

2. The method of claim 1 wherein:
providing the multi-layer molded conductive structure comprises:
providing the second conductive pattern wider than the second conductive pillar where the second conductive pillar is attached to the first portion of the second conductive pattern;
providing the second conductive pattern having a side surface that is embedded in the second encapsulant; and
providing the outer surface of the second conductive pattern substantially flush with the second encapsulant.

3. The method of claim 1, wherein providing the multi-layer molded conductive structure comprises:
providing the carrier having the first surface;
forming the first conductive pattern on the first surface of the carrier;
forming the first conductive pillar electrically coupled to the first conductive pattern;
thereafter forming the first encapsulant onto the first conductive pattern and the first conductive pillar;
removing a portion of the first encapsulant to expose the first conductive pillar on the second surface of the first encapsulant;
forming the second conductive pattern electrically coupled to the first conductive pillar;
forming the second conductive pillar electrically coupled to a first portion of the second conductive pattern;
thereafter forming the second encapsulant onto the second conductive pattern and second conductive pillar;
removing a first portion of the second encapsulant to form the receiving space that exposes the second portion of the second conductive pattern; and
thereafter removing a second portion of the second encapsulant to expose the second conductive pillar in the second surface of the second encapsulant.

4. The method of claim 1, wherein electrically coupling the first semiconductor die comprises directly connecting the first semiconductor die to the second portion of second conductive pattern in the receiving space.

5. The method of claim 4, wherein electrically coupling the first semiconductor die comprises electrically coupling the first semiconductor die having a major surface that resides on substantially the same plane as the second surface of the second encapsulant.

6. The method of claim 1, further comprising:
attaching a conductive bump to the second conductive pillar before removing the carrier.

7. The method of claim 1, wherein providing the carrier comprises providing the carrier comprising one or more of a metal, silicon, glass or an epoxy resin.

8. A semiconductor package comprising: a first conductive structure comprising a first conductive pattern and a first conductive pillar attached to the first conductive pattern, wherein the first conductive pattern is wider than the first conductive pillar where the first conductive pillar is attached to the first conductive pattern, and wherein the first conductive pattern defines an outermost patterned conductive structure for the semiconductor package;
a first encapsulant encapsulating the first conductive structure, wherein:
the first conductive pattern has an outer surface exposed in a first surface of the first encapsulant;
the first conductive pattern has a side surface embedded within the first encapsulant;
the first conductive pillar is exposed in a second surface of the first encapsulant, which is opposite to the first surface of the first encapsulant; and
the outer surface of the first conductive pattern is substantially flush with the first surface of the first encapsulant;
a second conductive structure comprising a second conductive pattern electrically coupled to the first conductive structure and a second conductive pillar attached to a first portion of the second conductive pattern, wherein the second conductive pattern is wider than the second conductive pillar where the second conductive pillar is attached to the first portion of the second conductive pattern;
a second encapsulant encapsulating the second conductive structure, wherein:
the second conductive pattern has an outer surface exposed in a first surface of the second encapsulant;
a second portion of the second conductive pattern is provided absent the second encapsulant and absent the second conductive pillar; and
the second conductive pillar is exposed in a second surface of the second encapsulant opposite to the first surface of the second encapsulant; a receiving space disposed in the second encapsulant, wherein:

the receiving space exposes the second portion of the second conductive pattern: and the second portion of the second conductive pattern is provided absent direct physical contact in the receiving space to any first and second conductive pillars; a first semiconductor die electrically coupled to the second portion of the second conductive pattern;

a first underfill disposed between the second surface of the first encapsulant and a surface of the first semiconductor die, wherein the first underfill physically contacts side surfaces of the second portion of the second conductive pattern;

a passive element placed to be electrically coupled to the first conductive pattern adjacent the first surface of the first encapsulant, wherein:

the first conductive pillar and the second conductive pillar are laterally interposed between the passive element and the first semiconductor die such that the passive element does not overlap the first conductive pillar and does not overlap the second conductive pillar; and the first conductive pillar and the second conductive pillar are electrically connected;

a third encapsulant encapsulating the passive element wherein the passive element and the first semiconductor die do not overlap; and a second semiconductor die attached to the outer surface of the first conductive pattern such that the second semiconductor die is adjacent to the first surface of the first encapsulant and the first semiconductor die is adjacent to the second surface of the first encapsulant, and wherein the second semiconductor die and the first semiconductor die only partially laterally overlap, and wherein the third encapsulant encapsulates the second semiconductor die.

9. The semiconductor package of claim 8, wherein:
sidewall surfaces of the second encapsulant define the receiving space;
the sidewall surfaces are sloped;
the first semiconductor die is directly connected to the second portion of second conductive pattern in the receiving space;
the second conductive pattern has a side surface that is embedded in the second encapsulant; and
the outer surface of the second conductive pattern is substantially flush with the second encapsulant.

10. The semiconductor package of claim 8 further comprising: a conductive bump attached to the second conductive pillar adjacent the second surface of the second encapsulant.

11. A semiconductor package comprising:
a first conductive pattern;
a first conductive pillar connected to the first conductive pattern, wherein the first conductive pattern is wider than the first conductive pillar where the first conductive pillar is connected to the first conductive pattern, and wherein the first conductive pattern defines an outermost patterned conductive structure for the semiconductor package;
a first encapsulant encapsulating the first conductive pattern and the first conductive pillar, wherein:
the first conductive pattern has an outer surface exposed in a first surface of the first encapsulant; and
the first conductive pillar is exposed in a second surface of the first encapsulant, which is opposite to the first surface of the first encapsulant;
a second conductive pattern electrically connected to the first conductive pillar where the first conductive pillar is exposed in the second surface of the first encapsulant;
a second conductive pillar connected to a first portion of the second conductive pattern;
a second encapsulant encapsulating a first portion of the second conductive pattern and a portion of the second conductive pillar, wherein;
the second conductive pattern has an outer surface exposed in a first surface of the second encapsulant that adjoins the second surface of the first encapsulant; and
the second conductive pillar is exposed in a second surface of the second encapsulant opposite to the first surface of the second encapsulant;
a receiving space provided in the second encapsulant exposing at least a second portion of the second conductive pattern, wherein the receiving space has sloped sidewall surfaces and wherein the second portion is provided absent direct physical contact in the receiving space to any first and second conductive pillars;
a first semiconductor die in the receiving space and electrically connected to the second portion of the second conductive pattern;
a first underfill disposed between the second surface of the first encapsulant and a surface of the first semiconductor die, wherein the first underfill physically contacts side surfaces of the second portion of the second conductive pattern in the receiving space,
a second semiconductor die and a passive element placed to be electrically coupled to the first conductive pattern adjacent the first surface of the first encapsulant, wherein the first conductive pillar is laterally interposed between the passive element and the first semiconductor die such that the passive element does not overlap the first conductive pillar, and
a third encapsulant encapsulating the second semiconductor die and the passive element, wherein the passive element and the first semiconductor die do not overlap, and wherein the second semiconductor die and the first semiconductor die only partially overlap.

12. The semiconductor package of claim 11, wherein:
the first semiconductor die is directly connected to the second conductive pattern in the receiving space;
the semiconductor package further comprises at least one conductive bump coupled to a portion of the second conductive pillar exposed to the outside of the second encapsulant;
the first conductive pattern has a side surface embedded within the first encapsulant;
the outer surface of the first conductive pattern is substantially flush with the first encapsulant;
the second conductive pattern is wider than the second conductive pillar where the second conductive pillar is connected to the first portion of the second conductive pattern;
the first portion of the second conductive pattern comprises side surface embedded within the second encapsulant; and
the outer surface of the second conductive pattern is substantially flush with the second encapsulant.

* * * * *